United States Patent [19]

Fernandes et al.

[11] Patent Number: 4,886,980
[45] Date of Patent: Dec. 12, 1989

[54] TRANSMISSION LINE SENSOR APPARATUS OPERABLE WITH NEAR ZERO CURRENT LINE CONDITIONS

[75] Inventors: Roosevelt A. Fernandes, Liverpool, N.Y.; Richard L. Sieron, Fairfield, Conn.

[73] Assignee: Niagara Mohawk Power Corporation, Syracuse, N.Y.

[21] Appl. No.: 234,688

[22] Filed: Aug. 22, 1988

Related U.S. Application Data

[63] Continuation of Ser. No. 795,167, Nov. 5, 1985, Pat. No. 4,808,917.

[51] Int. Cl.⁴ .............................................. H02J 9/00
[52] U.S. Cl. .................................... 307/64; 307/66; 307/129; 307/130; 324/126; 340/870.17; 310/308
[58] Field of Search ..................... 307/64, 66, 48, 52, 307/128, 129, 130, 131, 87; 324/51, 78 R, 126, 127; 340/870.11, 870.16, 870.17, 870.28, 870.37, 870.38, 870.39; 361/44, 45, 57, 56, 63, 64, 65, 72, 79, 78, 86, 87, 88, 90, 91, 92, 93; 310/308, 309, 310; 364/492, 493

[56] References Cited

U.S. PATENT DOCUMENTS

| 4,268,818 | 5/1981 | Davis et al. | 340/310 R X |
| 4,384,289 | 5/1983 | Stillwell et al. | 340/870.17 |
| 4,420,752 | 12/1983 | Davis et al. | 340/870.17 |
| 4,573,041 | 2/1986 | Kitagawa et al. | 340/538 |
| 4,625,172 | 11/1986 | Yamamura et al. | 324/127 X |
| 4,635,055 | 1/1987 | Fernandes et al. | 340/870.17 |
| 4,686,630 | 8/1987 | Marsland et al. | 364/492 |
| 4,728,887 | 3/1988 | Davis | 340/870.17 |

Primary Examiner—William M. Shoop, Jr.
Assistant Examiner—Paul Ip
Attorney, Agent, or Firm—Lalos & Keegan

[57] ABSTRACT

A self contained sensor module mounted on a power transmission line. The module is capable of measuring various parameters such as line current, voltage, conductor temperature, and ambient temperature. The parameter values are processed by sensor electronics which digitize and transmit the values to a ground receiver. The sensor module normally derives its power through electromagnetic induction resulting from current flowing through the transmission line. The module contains a power back-up system, including a battery, which allows sensor operation with minimum current and zero current in the transmission line. The battery is float charged while the sensor is mounted on the transmission line using excess energy derived through electromagnetic induction. When line current drops to a predetermined minimum value, float charging is disabled and the battery supplies power to the sensor module. When battery power is depleted to a predetermined level, data processing and transmission are disabled until the battery can be recharged.

7 Claims, 7 Drawing Sheets

TRANSMISSION LINE SENSOR APPARATUS OPERABLE WITH NEAR ZERO CURRENT LINE CONDITIONS

This is a continuation of co-pending application Ser. No. 795,167 filed on Nov. 5, 1985 now U.S. Pat. No. 4,808,917.

CROSS-REFERENCE TO RELATED APPLICATIONS

This application is is also a continuation-in-part of copending applications Ser. No. 484,681, filed Apr. 13, 1983, now U.S. Pat. No. 4,689,752, Ser. No. 564,924, filed Dec. 23, 1983, now U.S. Pat. No. 4,635,055 and Ser. No. 669,589, filed Nov. 8, 1984, now abandoned U.S. Pat. Nos. 4,689,752 and 4,635,055 are incorporated herein by reference. This application is also related to the application of Roosevelt A. Fernandes, entitled Transmission Line Sensor Apparatus Operable With Minimum Current and Zero Current Line Conditions, filed concurrently with this application.

BACKGROUND OF THE INVENTION

This invention relates to apparatus for measuring operating parameters of a high voltage power conductor. More particularly, it relates to radio transmitting sensors which are mounted on the transmission lines. The sensors normally derive their power through electromagnetic induction using the magnetic field generated as a result of current flowing through the transmission line conductor. Transmission line sensors of the above type are disclosed in the U.S. patent of Howard R. Stillwell and Roosevelt A. Fernandes entitled Transponder Unit for Measuring Temperature and Current on Live Transmission Lines, U.S. Pat. No. 4,384,289, issued May 17, 1983, which patent is incorporated herein by reference.

Various power line sensors have been disclosed in the prior art. For example, see U.S. Pat. Nos. 3,428,896; 3,633,191; 4,158,810 and 4,268,818. Sensors of this type and of the improved form disclosed in the above-identified Stillwell and Fernandes patent have been proposed for dynamic line rating of electrical power transmission lines. See for example, papers numbered 82 SM 377-0 and 82 SM 378-8 entitled DYNAMIC THERMAL LINE RATINGS, PART 1, DYNAMIC AMPACITY RATING ALGORITHM; and, DYNAMIC THERMAL LINE RATINGS, PART II, CONDUCTOR TEMPERATURE SENSOR AND LABORATORY FIELD TEST EVALUATION; papers presented at the Institute of Electrical and Electronic Engineers P.E.S. 1982 summer meeting. These papers are incorporated herein by reference.

The power line sensors available in the prior art measure quantities associated with operation of the overhead line such as voltage on the conductor, current flow in the conductor, conductor temperature and ambient temperature. The information gathered is transmitted to a local ground station. Data from various ground receivers is transmitted to a central control station where the information is analyzed. Based on this analysis, the entire power system is controlled with power being supplied to the various transmission lines in accordance with their measured parameters.

The compact toroidal-shaped sensors, disclosed in U.S. Pat. No. 4,384,289 and in the prior copending applications of Fernandes et al., contain the sensor electronics, power supply and transmitter circuits, and hardware for attaching the sensors to the transmission lines. These sensors are operable only when the line current of the monitored conductor is at or above the minimum value necessary to power the sensor electronics. It is often desirable, however, to permit sensor operation when line currents are below the threshold level, i.e. for monitoring very low current conditions or detection of energized conductors with zero current flow.

It has been suggested that a battery be added to the power supply to allow sensor operation when the line current is insufficient to power the sensor and transmitter circuits. However, this arrangement would require periodic removal and/or replacement of the battery for recharging, with back-up capability always being uncertain. The present invention avoids the disadvantages of the prior art by providing a reliable power back-up system.

In accordance with the present invention, a toroidal-shaped transmission line sensor module is provided with a battery back-up facility which provides power for the module during very low current line conditions. The sensor module power supply, which derives power from transmission line current, will power the sensor module electronics under normal operating conditions. The battery is maintained in a float mode which enables it to be recharged by the power supply if the charge level of the battery is depleted. A sensing circuit detects if the regulated voltage supplied by the power supply is less than the battery voltage. If this condition is detected, power to the sensor electronics will be supplied by the battery. If this condition persists and the battery charge falls below a certain level, the load is removed from the battery to prevent damage.

It is therefore an object of the invention to provide a transmission line sensor which can operate under the condition of low transmission line current.

Another object is to provide power back-up for the sensor when the transmission line current is below a threshold level.

A further object of the invention is to provide monitoring circuitry which switches between main power and back-up battery power as a function of the capacity of the line current to provide a regulated voltage through the power supply that is higher than the battery voltage.

Another object of the invention is to provide monitoring circuitry which inhibits data transmission when the battery charge is depleted to a certain level.

Still another object of the invention is to provide a power back-up system in which the back-up battery is constantly float charged when the power requirements of the sensor module are being met fully through electromagnetic induction from the line current.

DETAILED DESCRIPTION

The transmission line sensors embodying the present invention monitor a variety of conductor parameters. Each sensor is equipped to measure line current, line to neutral voltage, frequency, phase angle, conductor temperature, and ambient temperature. The values of the monitored parameters are fed to a central location which uses the information to control an entire transmission system.

Figure 1:
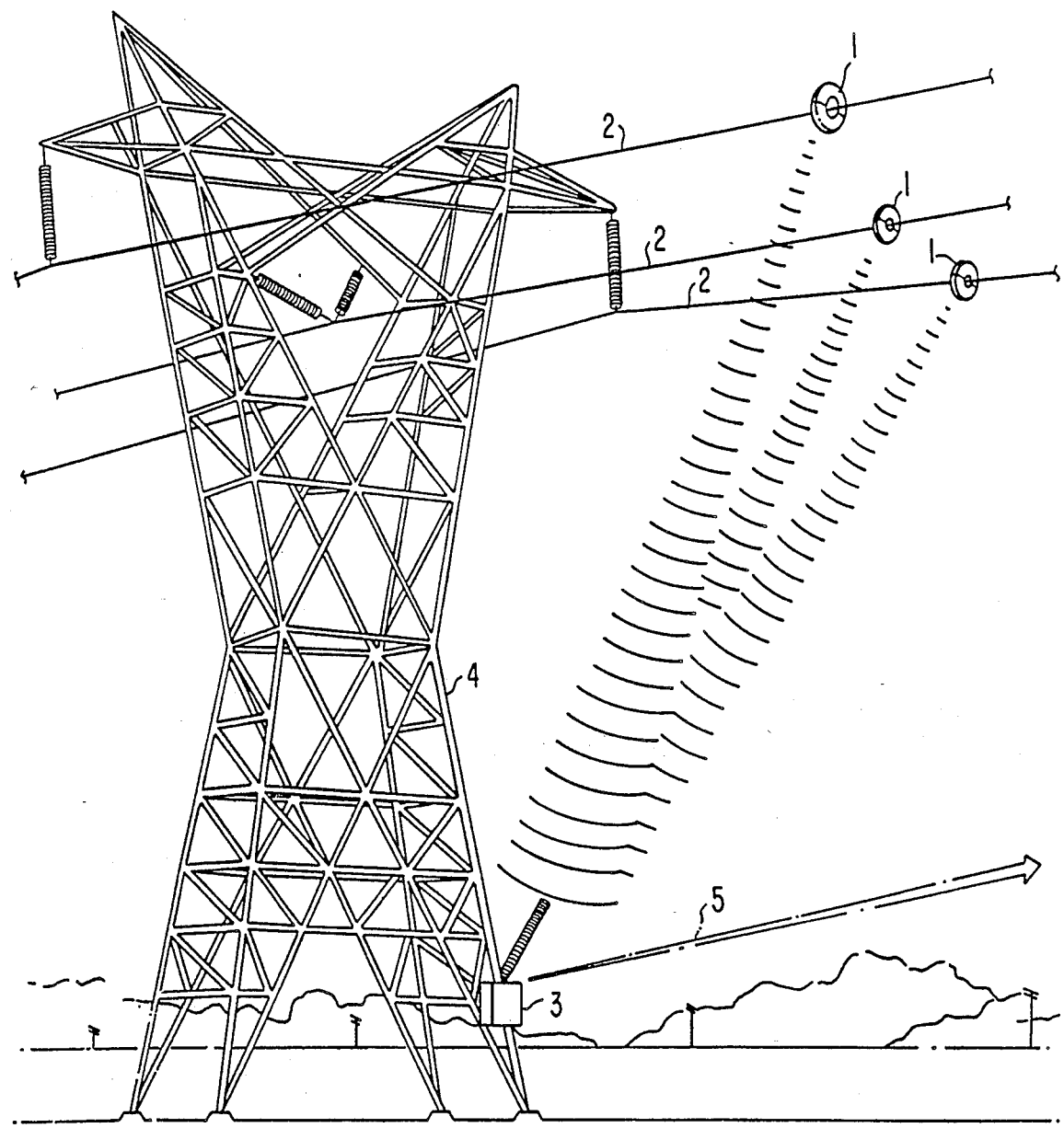
FIG. 1 is a view of several sensor modules attached to the three phase conductors of an electric power line and apparatus for transmitting the measured parameters.

FIG. 1 illustrates several sensors 1 mounted on power conductors 2. Each sensor includes electronics which process and digitize the parameter values and assemble the digital data into appropriate encoded messages. Sensor module electronics include a microprocessor, RAM, I/O, and timer components as disclosed in co-pending application Ser. No. 484,681. The digital data is transmitted by the sensor modules 1 to a local ground station 3 which may be mounted on an electrical transmission tower 4. The digital data is transmitted, for example, by means of a 950 MHz FM radio link in a 16 millisecond burst.

Ground station 3 includes a microprocessor which further processes the data. For example, data received from the 3 phase set of FIG. 1 can be used to calculate power parameters such as total circuit kilowatts, kilovars, and voltamps. The ground station 3 includes provisions for conversion of data to the form and parameters required by the central station.

Ground station 3 transmits its data to a central monitoring host computer (typically once a second) over data link 5 (e.g. radio, land lines, or satellite channels). The measured data is then processed by the control computer which issues appropriate control signals over other transmission links to switchgear at electrical substations. Thus the power supply to transmission lines may be varied in accordance with their measured temperature and electrical parameters.

Figure 2:
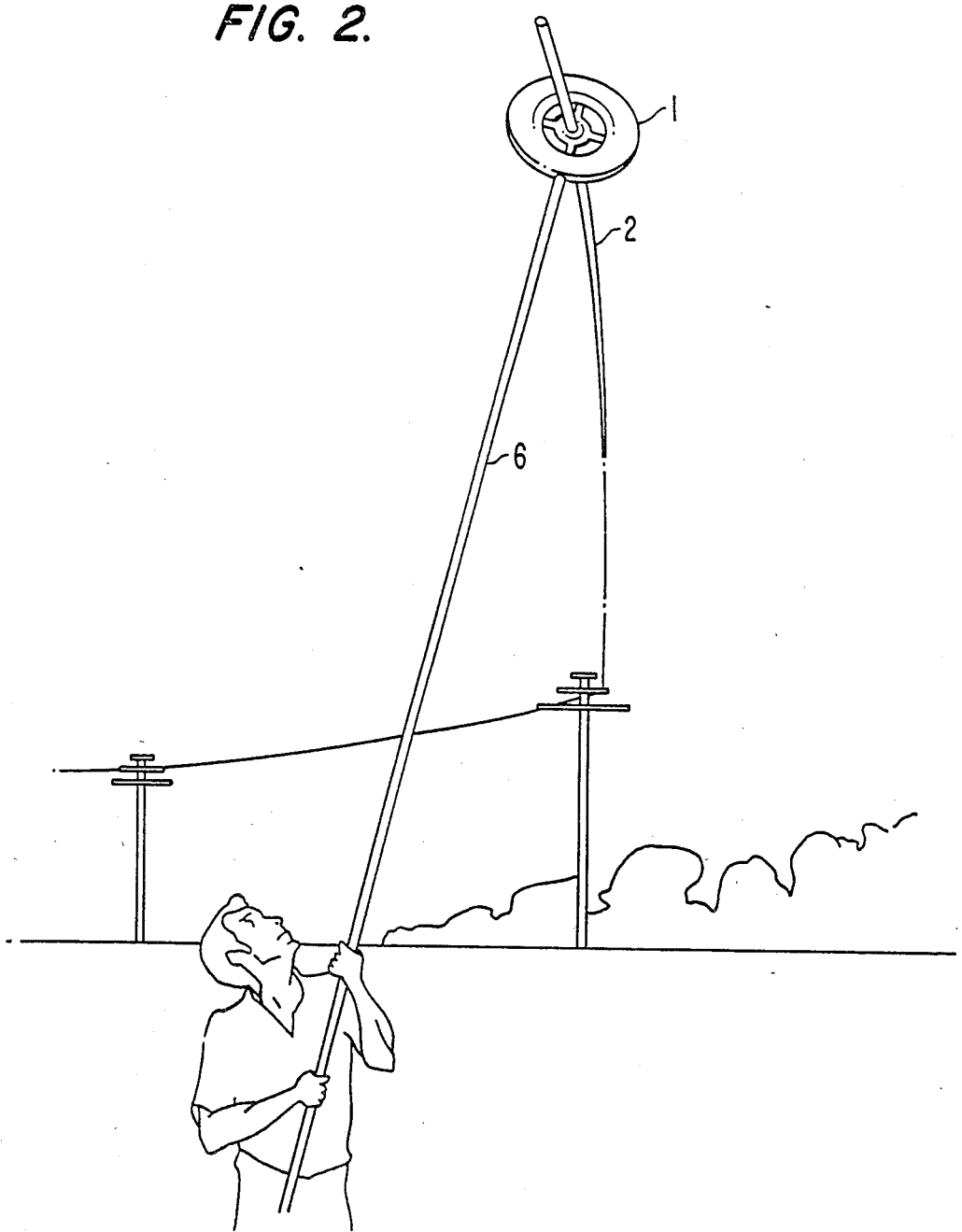
FIG. 2 is a view of a permanent or semi-permanent sensor module embodying the present invention being mounted on a transmission line.

The sensor modules can be placed throughout the power transmission system to monitor line characteristics and ensure effective reliable system control. As illustrated in FIG. 2, the modules 1 can be easily and quickly mounted on a line conductor 2 using a "hot stick" 6.

The size, shape, and operating characteristics of the sensor modules enable its use in a wide variety of conditions and situations. Each module is relatively small and shaped like a donut, with a 12⅝" major diameter and a maximum thickness of 4¾". It weighs approximately 18 pounds. Environmental operating conditions include: ambient air temperature range of −40° C. to +45° C.; driving rain, sleet, snow, and ice buildup; falling ice from overhead conductors; sun loading; and vibrations of conductors 2. All electronics within the module are sealed in water-tight compartments, and the module is protected against lightning surges by MOV devices and proper grounding and shielding. All exterior surfaces are rounded and free from sharp edges so as to prevent corona.

Figure 3:
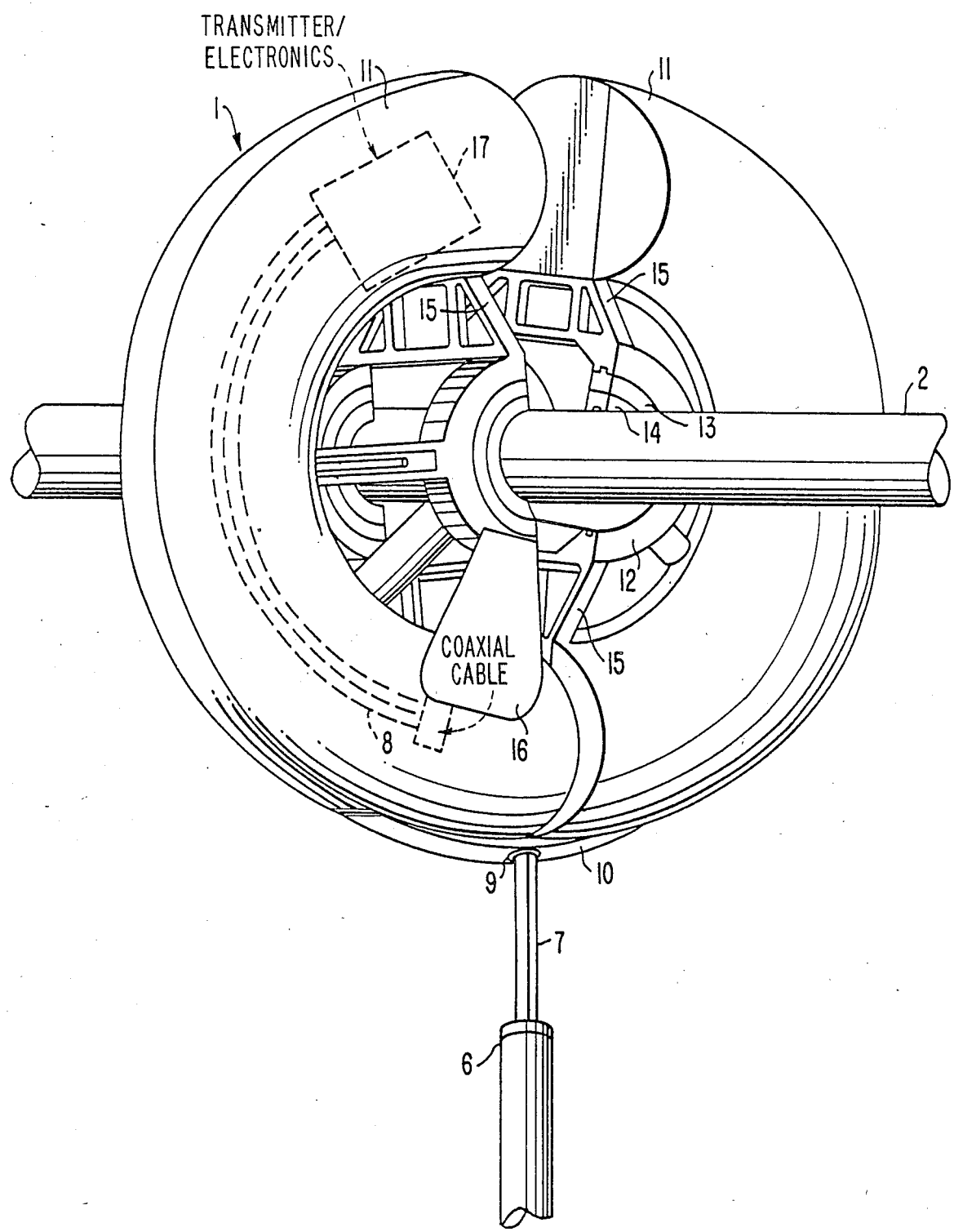
FIG. 3, is a perspective view showing the sensor module being mounted on an energized conductor.
Figure 4:
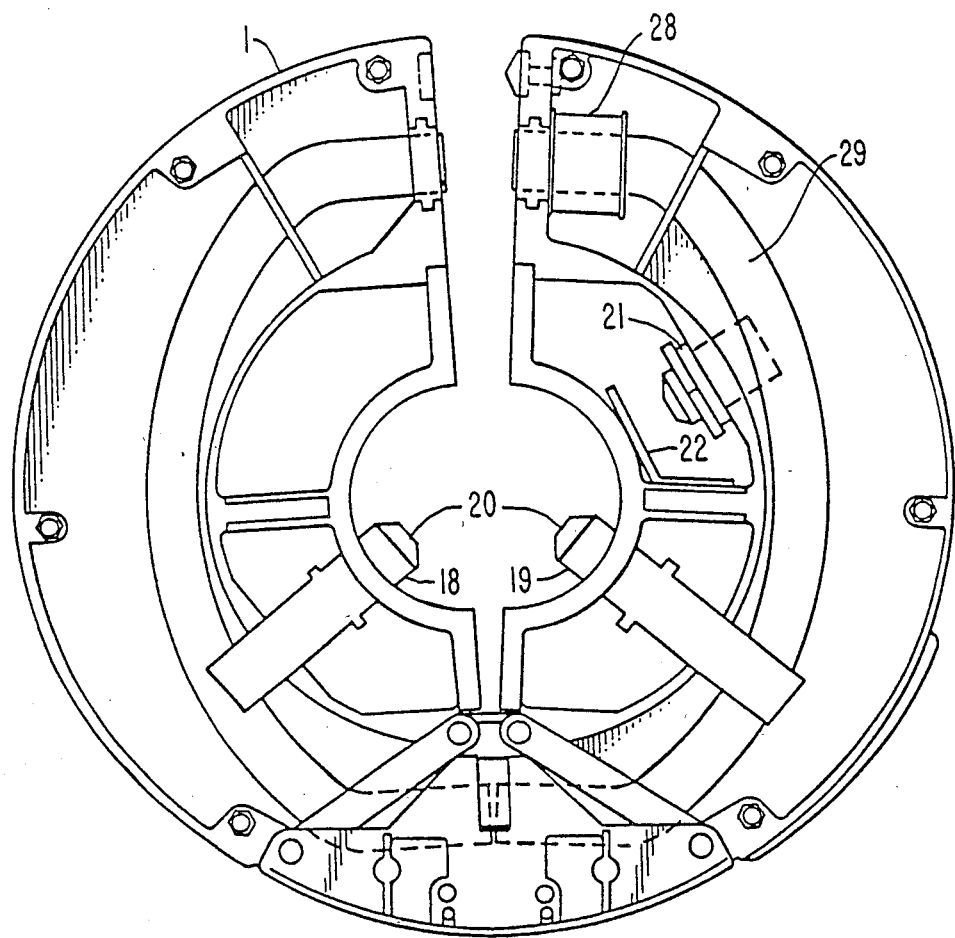
FIG. 4 is a cross section view of a sensor module.

FIGS. 3 and 4 illustrate the configuration of the sensor module's exterior and interior, respectively. As shown in FIG. 3, the module contains two lower sections 10 and two covers or upper sections 11, held together by six bolts (not shown). Each lower section 10 is provided with a top hub 13 and a bottom hub 14, supported by three open radial webs 15. The sensor housing, generally indicated at 1, is secured to a clamping jaws assembly 12 by the open radial webs 15. The diameter of the internal opening of the assembly is variable and is selected for each specific application. The assembly diameter can be chosen to accommodate different power cables from 0.5" to 2" in diameter. An R.F. impedence matching network 16, mounted near assembly 12, is connected via coaxial cable parts 8 to a shielded transmitter and electronics shown generally at 23 inside module 1.

Also shown in FIG. 3 is a hot stick tool with an Allen wrench portion 7 which fits within a hole 9 in module 1 mounted on conductor 2. With the hot stick tool 6 inserted into module 1, the hot stick is turned in one direction to cause the module to split so that it can be placed over a conductor. Turning the hot stick in the opposite direction causes the module to close over the conductor and clamp onto it tightly. The tool 6 can then be removed by simply pulling it away. Reinsertion and turning will open the module and allow it to be removed from the transmission line. This placement/removal feature provides great flexibility in locating the modules in the transmission system.

FIG. 4 illustrates the sensor components which measure the temperature parameters of the transmission line. The temperature of the transmission line is measured by conductor temperature probes 18 and 19. These probes are spring loaded against the conductor when the module is installed. The contacting tip 20 is beryllia and inhibits corrosion and yet conducts heat efficiently to the temperature transducer within. It is a non-conductor of electricity so as not to create a low resistance path from the conductor to the electronics. An ambient probe 21 is provided with a shield 22 covering the hub area so that the probe measures the temperature of the air rather than the temperature of the conductor. The hub and spoke area in the center of the module and the temperature probe placement are designed with as much free space as possible so as not to affect the temperature of the conductor.

Figure 5:
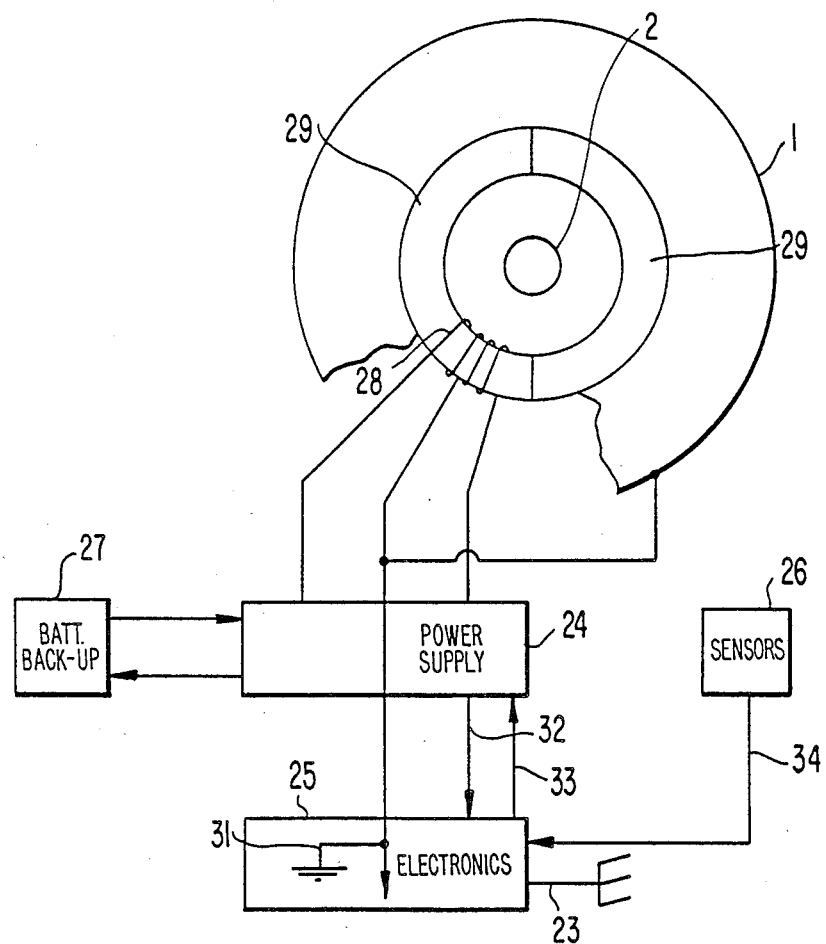
FIG. 5 is a general block diagram of the power supply system and electronics of a sensor module.

FIG. 5 illustrates the electronics of sensor module 1 in their overall configuration. They comprise a power supply 24, digitizing and transmitting electronics 25, sensors 26, antenna 17, and the battery back-up apparatus of the present invention shown generally as 27.

Power to operate the sensor module electronics is normally derived from winding 28 on a laminated iron core 29 which surrounds line conductor 2. This core is split to accommodate the opening of the module when it clamps around the conductor. The power supply 24 supplies regulated +5 and −5 volts to the electronics 25 and an additional switched +12 volts for the transmitter as indicated at 32. Local ground is indicated at 31. The electronics 25 provide a transmitter control signal on line 33 to control the power supply to the transmitter. The sensors 26 provide analog signals indicated at 34 to the electronics 25. A detailed electrical circuit diagram of power supply 24 is disclosed in co-pending application Ser. No. 484,681.

Figure 6:
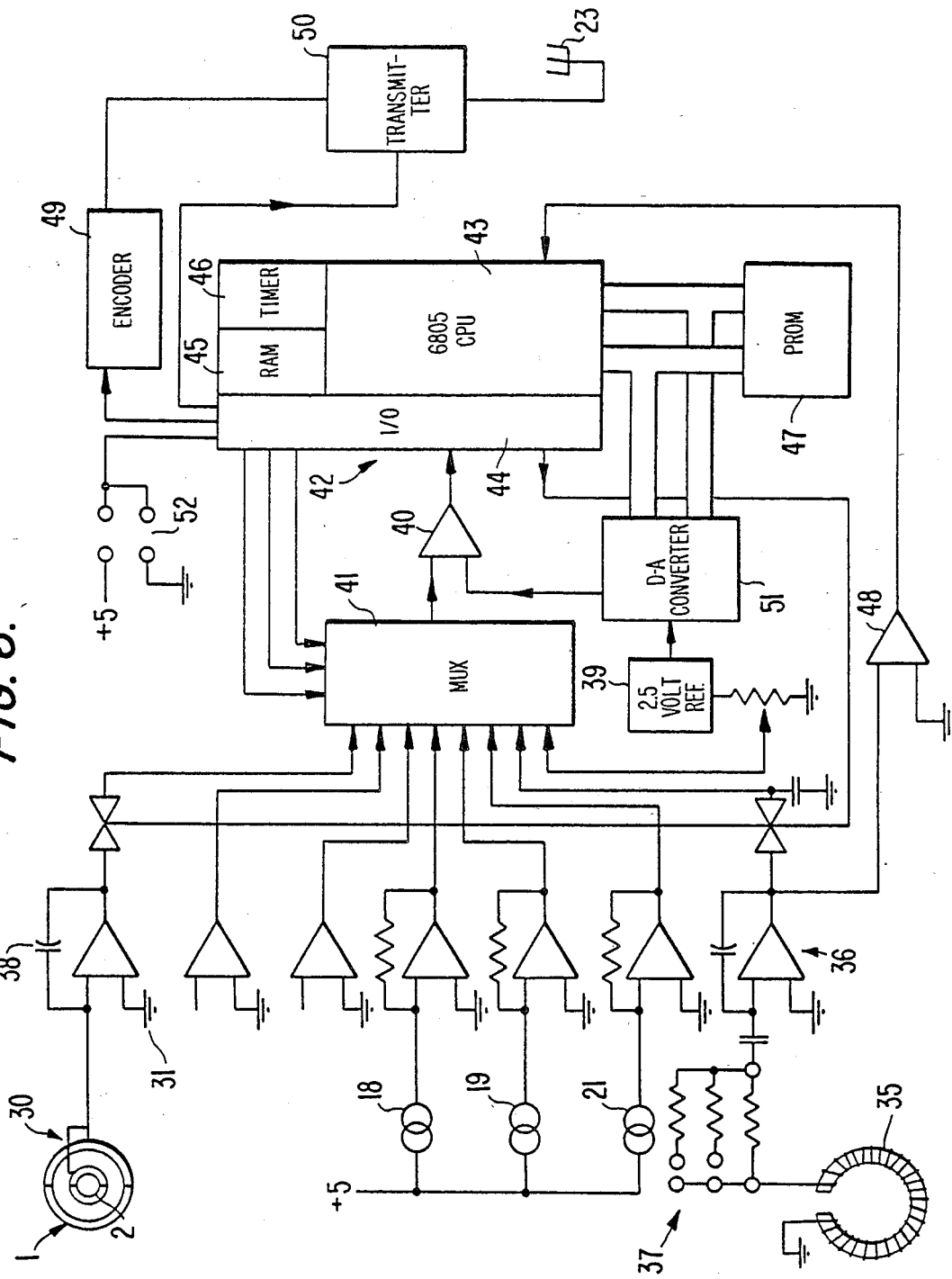
FIG. 6 is a block diagram of the electronics of the sensor module.

FIG. 6 is a block diagram of the electronics 25. Conductor current is measured by the Rogowski coil 35 which is connected to one of a plurality of input amplifiers 36 through current range select resistors 37. Voltage sensing apparatus consisting of the housing and insulated hub generally indicated at 30 is connected to the uppermost amplifier which is provided with a capacitor 38 in the feedback circuit which sets gain and provides an amplifier output voltage in phase with line to neutral high tension voltage. It also provides integrator action for the measurement of current the same way as the amplifier connected to the Rogowski coil. Thus amplifier 36 connected to the voltage sensing apparatus 30 is a low impedance current measuring means connected between the power conductor 2 and insulated hub portions 13 and 14.

Each of the temperature transducers 18, 19, and 21 is connected to a separate one of the amplifiers 36 as shown. Spare amplifiers are provided for measurement of additional characteristics such as the interior temperature of module 1. Each of the amplifiers 36 is connected for comparison with the output of digital-to-analog converter 51 from 2.5 volts reference source 39 at comparator 40 by the multiplexer 41 under control of the digital computer 42. The digital computer may be a Motorola CMOS 6805 microprocessor 43 having I/O 44, RAM 45 and timer components 46. A programmable read only memory 47 is connected thereto for storing the program. A zero crossing detector 48 detects the zero crossings of the voltage or current in the Rogowski coil 35 and provides basic synchronization. A module ID number is selected by jumpers generally indicated at 52. The digitized data assembled into an appropriate message is encoded in Manchester code by the encoder 49 and supplied to a 950 MHz transmitter 50 which then supplies it to the antenna 17. A detailed schematic diagram of electronics 25 is disclosed in copending application Ser. No. 484,681.

Figure 7:
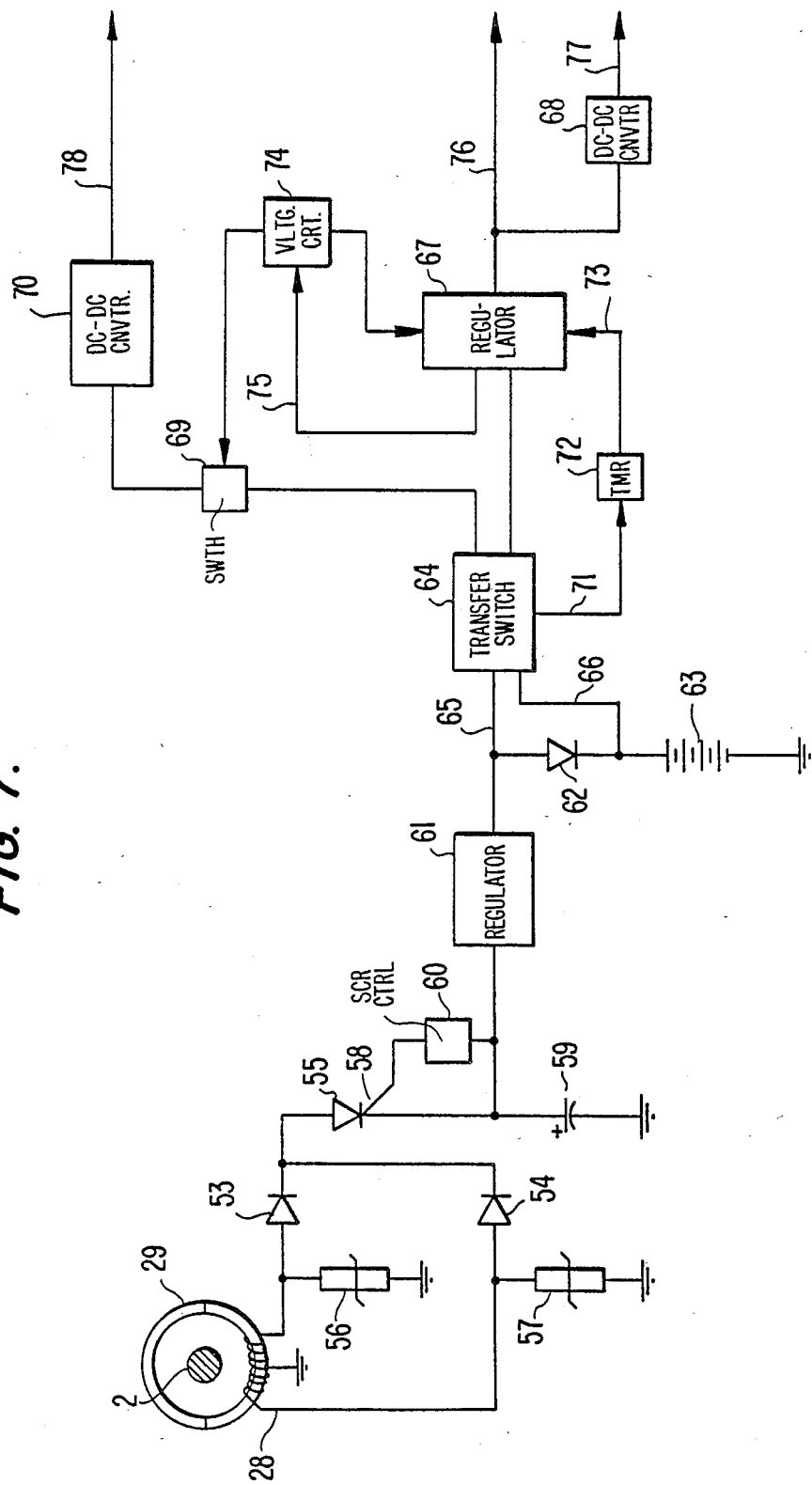
FIG. 7 is a schematic diagram illustrating the power back-up system of the present invention.

FIG. 7 illustrates the power back-up system of the present invention. It includes a rechargeable energy source, voltage monitoring circuitry, and battery control and charging circuitry. Without the apparatus of the present invention, measurement of transmission line parameters was not possible below a line current threshold of approximately 15 amperes. Below this threshold level, the inductive power from the line current is insufficient to operate the sensor module electronics and transmitter.

Referring to FIG. 7, during typical operation, i.e. with line current above the minimum threshold value, power is derived though electromagnetic induction using the magnetic field generated as a result of current flowing through conductor 2. The hinged iron core transformer with the line conductor forming the single turn primary supplies all internal power to the sensor module. Current in the conductor 2 induces voltage and current in winding 28 on iron core 29 which is rectified by rectifier diodes 53 and 54, producing a full wave rectified waveform at the anode of silicon controlled rectifier 55. Protection against power surges is provided by MOV devices 56 and 57.

The gate or terminal 58 of rectifier 55 is controlled by control circuit 60 to produce raw DC power at capacitor 59. The raw DC power is delivered to regulator 61 which produces approximately +7.5 volts DC at its output. Under normal operating conditions, the regulator 61 will provide a constant float voltage of 7.05 volts to power storage device 63 through diode 62. In the preferred embodiment of the present invention, storage device 63 is a 6-volt lead-acid battery. However, it is contemplated that any type of rechargeable battery or secondary storage device could be employed. If the storage device 63 is not fully charged (i.e. in a "float" condition), regulator 61 will produce a charging current to storage device 63 through diode 62 to the extent of its current-limit capability.

The voltage of regulator 61 is delivered to transfer switch 64 on line 65 and the voltage of storage device 63 is delivered to transfer switch 64 on line 66. Under normal operating conditions, i.e. conductor current above minimum threshold, the voltage delivered by regulator 61 will be greater than the voltage delivered by storage device 63. Transfer switch 64 will transfer the regulator voltage to the rest of the power supply circuit under this condition. If the conductor current falls below the minimum threshold and power derived from the conductor is low or zero, the voltage delivered by storage device 63 will be greater than the regulator voltage. Under this condition, transfer switch 64 will transfer the storage device voltage to the rest of the power supply circuit. As a result, even with minimum current in the conductor, the power requirements of the sensor will be met by the back-up power storage device. The output voltage of transfer switch 64 will range from approximately 7.05 volts down to 5.6 volts depending on the level of conductor current and level of charge in storage device 63.

The output voltage of transfer switch 64 is further regulated by regulator 67. Regulator 67 produces +5 volts on line 76 to be used by the sensor's digital logic and analog circuitry. The +5 volts is also sent to DC-DC converter 68 which produces −5 volts on line 77 to be used by analog circuitry. The output voltage of transfer switch 64 is also delivered through switch 69 to DC-DC converter 70 which produces +12 volts on line 78 for the radio transmitter.

When transfer switch 64 switches to storage device 63 as the source of sensor power, a logic signal indicating this condition is sent on line 71 to timer 72. Timer 72 produces a signal which is sent on line 73 to regulator 67 which causes regulator 67 to cycle on and off. Regulator 67 is typically turned on for 1 second and turned off for 59 seconds when under control of timer 72. This feature helps to conserve battery power by enabling the +5 volt and −5 volt supplies for only 1 second out of each minute. The sensor's microprocessor, when provided with +5 volts for the one-second interval, will operate to process and transmit data. As a result, the ground station will receive data only once every minute when the sensor is operating on power supplied by back-up storage device 63. It is not necessary to turn the +12 volt supply on and off to conserve power because the transmitter is turned on by the microprocessor only during the 16 millisecond transmission burst.

In order to prevent damage to storage device 63 as a result of complete discharge, a low voltage disconnect circuit 74 is provided to sense the level of voltage on line 75 provided by storage device 63 to regulator 67 through transfer switch 64. If storage device 63 becomes depleted and its output voltage is reduced to a minimum level, low voltage disconnect circuit 74 will turn off regulator 67 and switch 69 thereby removing storage device 63 from the load. Although the transmitter will never turn on when power is not supplied to the microprocessor, switch 69 is turned off because the 12 volt DC-DC converter 70 does use some amount of power.

From the foregoing description, it can be seen how the present invention provides numerous advantages over the currently available transmission line sensors.

The present invention extends the capabilities of the sensor module using an energy storage device. This feature allows the sensor to make line measurements and to transmit those measurements even with minimum current in the line conductor.

The energy storage device, e.g. rechargeable battery, is float charged during normal operation when the sensor module power requirements are met fully through electromagnetic induction and the power supply transformer.

Voltage sensing circuity is provided to determine when the voltage generated as a result of conductor current is below the voltage level supplied by the energy storage device. When conductor-current generated voltage is above energy storage voltage, the energy storage device is float charged to its capacity. Otherwise, back-up power is selected and the sensor electronics are powered by the energy storage device.

The energy storage device is protected by monitoring its voltage level when it is selected as the power source. When the voltage level of the energy device reaches a minimum level, the load is disconnected to prevent total discharge.

We claim:

1. A system for monitoring a plurality of parameters associated with each of a plurality of energized electrical power conductors, on power system circuits operable over a load range between predetermined minimum and maximum conductor currents in either direction, said system comprising:
   (a) a plurality of sensor modules for measuring the parameters of said conductors while said conductors are energized, one of said modules being mounted upon each of said energized conductors;
   (b) means carried by each of said modules for measurement of conductor voltage;
   (c) means carried by each of said modules for measurement of the current through said conductor over said entire load range;
   (d) means carried by each of said modules for processing and storing said sensed values of conductor voltage and conductor current;
   (e) means carried by each of said modules for transmitting signals comprising a sequence of data commensurate with said measured values;
   (f) power supply means for providing power to each of said processing means and each of said transmitting means from said conductor current when the latter is above a predetermined value;
   (g) a rechargeable energy storage device in each of said modules for providing power to its respective processing and transmitting means when said conductor current is below said predetermined value;
   (h) charging means coupled to said power supply means and said storage device for float charging said storage device from said power supply means; and
   (i) means remote from said modules for receiving said signals from said transmitting means of each of said plurality of sensor modules, decoding said signals and calculating voltage and current of each of said conductors.

2. The system according to claim 1 wherein said rechargeable energy storage device in each module is a battery.

3. The system according to claim 2 and further including means carried by each of said modules for charging said battery by energy derived from said energized conductors.

4. The system according to claim 1 and further including means carried by each of said sensor modules for establishing the phase relationship between said sensed values of conductor voltage and conductor current, and wherein said signals include data commensurate with said phase relationship.

5. The system according to claim 1 and further including means carried by each of said sensor modules for measuring the frequency of said conductor voltage and conductor current, and wherein said signals include data commensurate with the frequency of said conductor voltage and current.

6. The system according to claim 1 and further including means carried by each of said modules for calculating, from said sensed values of conductor voltage and current, and storing power and energy related quantities including megawatts, megawatthours and power factor, and said signals include data commensurate with said quantities.

7. The system according to claim 1 wherein said remote means includes means for calculating, from said values of conductor voltage and current, power and energy related quantities including megawatts, megawatthours and power factor.

* * * * *